United States Patent
Chew et al.

(10) Patent No.: US 10,910,340 B1
(45) Date of Patent: Feb. 2, 2021

(54) SILVER SINTERING PREPARATION AND THE USE THEREOF FOR THE CONNECTING OF ELECTRONIC COMPONENTS

(71) Applicant: Heraeus Deutschland GmbH & Co. KG, Hanau (DE)

(72) Inventors: Ly May Chew, Bruchköbel (DE); Seigi Suh, Chesterbrook, PA (US); Samson Shahbazi, Roslyn, PA (US); Wolfgang Schmitt, Rodgau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 0 days.

(21) Appl. No.: 16/601,375

(22) Filed: Oct. 14, 2019

(51) Int. Cl.
*H01L 23/00* (2006.01)
*B22F 1/00* (2006.01)
*B22F 7/06* (2006.01)

(52) U.S. Cl.
CPC ............ *H01L 24/83* (2013.01); *B22F 1/0074* (2013.01); *B22F 7/064* (2013.01); *H01L 24/29* (2013.01); *B22F 2201/10* (2013.01); *B22F 2301/255* (2013.01); *B22F 2304/10* (2013.01); *H01L 2224/29239* (2013.01); *H01L 2224/8384* (2013.01); *H01L 2224/83359* (2013.01); *H01L 2924/01013* (2013.01); *H01L 2924/01028* (2013.01); *H01L 2924/01029* (2013.01)

(58) Field of Classification Search
CPC ...................... H01L 24/83; H01L 24/29; H01L 2224/29239; H01L 2924/01028; H01L 2924/01013; H01L 2224/83359; H01L 2924/01029; H01L 2224/8384; B22F 1/0074; B22F 7/064; B22F 2304/10; B22F 2201/10; B22F 2301/255
See application file for complete search history.

(56) References Cited

U.S. PATENT DOCUMENTS

| | | | | |
|---|---|---|---|---|
| 2008/0156398 A1* | 7/2008 | Yasuda | .................. | H01L 25/072 148/23 |
| 2009/0244868 A1* | 10/2009 | Morita | .................... | H01L 24/29 361/783 |
| 2011/0012262 A1* | 1/2011 | Morita | .................... | H01L 24/83 247/741 |
| 2012/0153011 A1* | 6/2012 | Schafer | ................ | B23K 35/362 228/248.1 |
| 2014/0306329 A1* | 10/2014 | Takagi | .............. | H01L 23/49582 257/669 |
| 2014/0374775 A1* | 12/2014 | Saito | ........................ | H01L 24/40 257/77 |
| 2015/0102383 A1* | 4/2015 | Golland | .............. | H01L 23/3675 257/140 |
| 2016/0101486 A1* | 4/2016 | Endoh | ................... | B22F 1/0022 228/115 |
| 2016/0151864 A1* | 6/2016 | Rector | ............... | B23K 35/3006 428/615 |
| 2017/0243849 A1* | 8/2017 | Sasaki | ...................... | H01B 1/22 |
| 2017/0294396 A1* | 10/2017 | Inoue | ...................... | H01L 24/32 |
| 2017/0317048 A1* | 11/2017 | Matsubara | .............. | H01L 24/29 |
| 2018/0056449 A1* | 3/2018 | Zhu | ...................... | B23K 35/3006 |
| 2018/0190611 A1* | 7/2018 | Tatsumi | ................... | H01L 24/83 |
| 2018/0315729 A1* | 11/2018 | Sugo | .......................... | C09J 7/35 |
| 2019/0170314 A1* | 6/2019 | Lenef | .................... | H01S 5/0071 |
| 2020/0094318 A1* | 3/2020 | Fujimoto | ................. | H01B 1/00 |
| 2020/0185347 A1* | 6/2020 | Hine | ........................ | B22F 7/08 |

FOREIGN PATENT DOCUMENTS

| | | |
|---|---|---|
| EP | 2998048 A1 | 3/2016 |
| WO | WO-2016028221 A1 | 2/2016 |
| WO | WO-2016149361 A1 | 9/2016 |

\* cited by examiner

*Primary Examiner* — John P. Dulka
(74) *Attorney, Agent, or Firm* — Blank Rome LLP

(57) ABSTRACT

A silver sintering preparation comprising:
(A) 30 to 88 wt.-% of silver flake particles having a mean particle diameter ($d_{50}$) in the range of >1 to 20 μm,
(B) 5 to 30 wt.-% of at least one silver precursor,
(C) 1 to 10 wt.-% of an organic polymer system, and
(D) 6 to 30 wt.-% of organic solvent,
wherein the organic polymer system (C) is chemically essentially stable at temperatures <300° C. and forms a continuous phase together with the organic solvent (D).

15 Claims, No Drawings

SILVER SINTERING PREPARATION AND THE USE THEREOF FOR THE CONNECTING OF ELECTRONIC COMPONENTS

The present invention relates to a silver sintering preparation and to a method for the connecting (joining) of electronic components, in which said silver sintering preparation is used.

Silver sintering technology has become state of the art as a method of connecting (joining) of electronic components, see, for example, WO2011/026623 A1, WO2011/0266243 A1 and WO2016/028221 A1, US 2017/0243849 A1 and US 2018/0056449 A1.

The term "electronic component" used herein refers to active and passive components being used in electronics; examples include diodes, LEDs (light emitting diodes), dies, IGBTs (insulated gate bipolar transistors), MOSFETs (metal oxide semiconductor field effect transistors), ICs (integrated circuits), sensors, heat sinks, resistors, capacitors, inductors, antennae, connecting elements (e.g. clips), lead frames, PCBs (printed circuit boards), flexible electronics, ceramic substrates, metal ceramic substrates, e.g. DCBs (direct copper bonded substrates), IMS (insulated metal substrate) and the like.

It has been disclosed that silver sinter joints can be formed on bare copper surfaces without applying mechanical pressure during a sintering process using a sinter paste based on silver nanoparticles or based on a mixture of silver microparticles (typically in the range of 1 to 10 μm in size) and silver nanoparticles (typically in the range of 1 to 100 nanometer in size). Examples of such disclosures comprise: H. Miyoshi, K. Endoh, S. Kurita, "Application of Silver Nano Particles to Pressureless Bonding onto a Copper Surface—Consideration of Substitute Material for Lead Solder", CIPS conference 2014; H. Zheng, D. Berry, K. D. T. Ngo, G. Lu, "Chip-Bonding on Copper by Pressureless Sintering of Nanosilver Paste Under Controlled Atmosphere", IEEE Transactions on Electronic components, Packaging and Manufacturing Technology, Vol. 4, No. 3, March 2014; H. Zheng, J. Calata, K. Nog, S. Luo, G. Lu, "Low-pressure (<5 MPa) Low-temperature Joining of Large-area Chips on Copper Using Nanosilver paste", CIPS conference 2012; and T. Watanabe, N. Nakajima, M. Takesue, "Material Design and Process Conditions of Pressureless Sintered Silver for 200/40° C. Thermal Cycling Reliability", PCIM Europe 2017.

It is an object of the invention to provide a silver sintering method for the connection of electronic components in reliable manner; typically such connection happens via metal contact surfaces of the electronic components. In particular, the silver sintering method to be found shall be well-suited for connecting electronic components, at least one of which having a non-precious metal contact surface like a copper surface with high reliability. It is another object of the present invention to provide a silver sintering preparation free of nanosized silver particles and that is well-suited for implementing such sintering method. Formation of reliable connections should be enabled even on non-pretreated non-precious metal contact surfaces of electronic components and even at low sintering temperatures with or without application of mechanical pressure during sintering.

The invention relates to a method for the connection of electronic components, in which (a) a sandwich arrangement is provided, which comprises at least (a1) an electronic component 1, (a2) an electronic component 2, and (a3) a silver sintering preparation being situated between metal contact surfaces of the electronic components, and in which (b) the sandwich arrangement is being sintered, whereby the silver sintering preparation comprises
(A) 30 to 88 wt.-% (% by weight) of silver flake particles having a mean particle diameter ($d_{50}$) in the range of >1 to 20 μm,
(B) 5 to 30 wt.-% of at least one silver precursor,
(C) 1 to 10 wt.-% of an organic polymer system, and
(D) 6 to 30 wt.-% of organic solvent,
wherein the organic polymer system (C) is chemically essentially stable at temperatures <300° C. and forms a continuous phase together with the organic solvent (D).

Moreover, the invention relates to a silver sintering preparation that comprises
(A) 30 to 88 wt.-% of silver flake particles having a mean particle diameter ($d_{50}$) in the range of >1 to 20 μm,
(B) 5 to 30 wt.-% of at least one silver precursor,
(C) 1 to 10 wt.-% of an organic polymer system, and
(D) 6 to 30 wt.-% of organic solvent,
wherein the organic polymer system (C) is chemically essentially stable at temperatures <300° C. and forms a continuous phase together with the organic solvent (D).

The silver sintering preparation of the invention comprises (A) 30 to 88 wt.-%, preferably 40 to 70 wt.-%, most preferably 50 to 70 wt.-% of silver flake particles having a mean particle diameter ($d_{50}$) in the range of >1 to 20 μm.

The term "silver flake particles" used herein refers to flakes (platelets) of pure silver (silver with a purity of at least 99.90 wt.-%, preferably at least 99.95 wt.-%) or of a silver alloy having a silver content in the range of 55 to <95 wt.-% or to flakes having a silver coating on a metal core other than silver, e.g. a copper core or a core of a copper alloyed with silver. Flakes are flat particles exhibiting an aspect ratio bigger than 10:1 as opposed to spheres (aspect ratio of 1:1) or granules (aspect ratio typically between 1 and 5).

The term "mean particle size" ("average particle size") used herein means the mean particle diameter ($d_{50}$) determined by means of laser diffraction. Laser diffraction measurements can be carried out making use of a particle size analyzer, for example, a Mastersizer 3000 from Malvern Instruments.

Usually, the silver flake particles (A) comprise a surface coating. Such coating of the silver flake particles (A) comprises at least one type of organic compound. The organic compounds serving as coating compounds prevent the silver flake particles (A) from agglomerating.

Preferred examples of such coating compounds include free fatty acids, fatty acid salts and fatty acid esters. The free fatty acids, fatty acid salts, and fatty acid esters preferably are non-branched. Moreover, the free fatty acids, fatty acid salts, and fatty acid esters preferably are saturated. Preferred fatty acid salts include ammonium, monoalkylammonium, dialkylammonium, trialkylammonium, aluminum, copper, lithium, sodium, and potassium salts. Alkyl esters, in particular methyl esters, ethyl esters, propyl esters, and butyl esters, are preferred esters. According to a preferred embodiment, the free fatty acids, fatty acid salts or fatty acid esters are compounds with 8 to 24, more preferably 8 to 18, carbon atoms. Examples of said fatty acids include caprylic acid (octanoic acid), capric acid (decanoic acid), lauric acid (dodecanoic acid), myristic acid (tetradecanoic acid), palmitic acid (hexadecanoic acid), margaric acid (heptadecanoic acid), stearic acid (octadecanoic acid), arachinic acid (eicosanoic acid/icosanoic acid), behenic acid (docosanoic acid), and lignoceric acid (tetracosanoic acid).

Particularly preferred coating compounds of the fatty acid or fatty acid salt type include dodecanoic acid, octadecanoic acid, aluminum stearate, copper stearate, sodium stearate, potassium stearate, sodium palmitate, and potassium palmitate.

Preferably, the fraction of organic compounds, in particular the fraction of compounds selected from the group consisting of free fatty acids, fatty acid salts, and fatty acid esters, relative to the entire coating is at least 60 wt.-%, more preferably at least 90 wt.-%, in particular at least 95 wt.-%, at least 99 wt.-% or 100 wt.-%.

The fraction of the coating compounds, preferably of the coating compounds selected from the group consisting of free fatty acids, fatty acid salts, and fatty acid esters, is <5 wt.-%, for example 0.01 to 2 wt.-%, preferably 0.3 to 1.5 wt.-%, relative to the weight of the coated silver flake particles (A).

The degree of coating, defined as the ratio of the mass of coating compounds and the surface area of the silver flake particles (A) preferably is 0.00005 to 0.03 g, more preferably 0.0001 to 0.02 g of coating compounds per square metre ($m^2$) of surface area of the silver flake particles (A).

The silver sintering preparation of the invention comprises 5 to 30 wt.-% of at least one silver precursor (B).

A silver precursor is a silver compound that decomposes at temperatures below 200° C. while releasing elemental silver. Accordingly, the use of a silver precursor in the sintering process is preferably associated with the in situ production of silver. Examples of silver precursors include silver carbonate, silver(I) lactate, silver(II) formate, silver citrate, silver oxide (for example AgO or $Ag_2O$). Silver carbonate, silver(I) oxide and silver(II) oxide are preferred silver precursors.

The silver precursor is preferably present in the form of particles. Such silver precursor particles can take the shape of flakes or a spherical (ball-like) shape. Preferably, the silver precursor particles are present in the form of flakes.

The silver sintering preparation of the invention comprises 1 to 10 wt.-%, preferably 2 to 7 wt.-% of an organic polymer system (C) which is chemically essentially stable at temperatures <300° C. and forms a continuous phase together with the organic solvent (D).

The organic polymer system (C)—in free form or in the presence of the other constituents of the silver sintering preparation of the invention—is chemically essentially stable at temperatures up to <300° C. and hence also within the temperature range prevailing during all steps of the method of the invention, in particular also during the sintering step (b). In still other words, the organic polymer system (C) does neither essentially decompose nor otherwise undergo an essential chemical change like, for example, undesired crosslinking reactions under said conditions.

The terms "crosslinkable" and "crosslinking" used herein are synonymous with "hardenable" and "hardening" or "curable" and "curing" by formation of covalent bonds. Covalent bond forming crosslinking reactions include in particular free-radical polymerization, condensation and/or addition reactions.

The chemical stability of the organic polymer system (C) can be determined by a qualitative and quantitative analytical comparison of the organic polymer system (C) within the silver sintering preparation with that of a sample of the silver sintering preparation having been sintered at a temperature <300° C. or within the actual temperature range prevailing during sintering step (b). An organic polymer system (C) chemically essentially stable at temperatures up to <300° C. will show no or only a small weight loss in the range of, for example, 0 to no more than 5 wt.-% on treating it under the conditions of sintering step (b). A weight loss can be determined or monitored, for example, by thermogravimetry with a heating rate of, for example, 5 K per minute.

Under said conditions such chemically essentially stable organic polymer system (C) will not only show no or only small weight loss; it will also show no change or increase of molecular mass. Molecular mass changes can be determined or monitored, for example, by gel permeation chromatography (GPC; divinylbenzene-crosslinked polystyrene as the immobile phase, tetrahydrofuran as the liquid phase, polystyrene standards).

The organic polymer system (C) consists of at least one organic polymer, i.e. there are no other constituents than one or more organic polymers, each of which being chemically essentially stable in the aforementioned sense. Hence, the at least one organic polymer does not decompose and is not self-crosslinkable under the conditions mentioned above, i.e. it does not have functional groups capable of performing a self-crosslinking reaction under said conditions. For example, the at least one organic polymer may have same or different functional groups which do not react with each other under said conditions; hence, a self-crosslinking can be prevented. To prevent misunderstandings, under said conditions there are neither crosslinking reactions within one individual organic polymer molecule nor between separate organic polymer molecules irrespective of whether the organic polymer system (C) consists of one, two or more organic polymers.

In an embodiment, the at least one non-self-crosslinkable organic polymer may comprise one or more organic polymers which are non-self-crosslinkable simply due to a lack of reactive functional groups or even due to a lack of any functional groups.

In another embodiment, the at least one non-self-crosslinkable organic polymer may comprise one or more organic polymers having functional groups which are non-reactive among one another under the aforementioned conditions.

In yet another embodiment, however, the at least one non-self-crosslinkable organic polymer may comprise one or more organic polymers of the externally crosslinkable type; here, the organic polymers comprise functional groups in principle capable of performing a crosslinking reaction under the aforementioned conditions, however, only in combination with separate (external) crosslinking agent(s). At least in this embodiment, the silver sintering preparation of the invention is free of any such separate crosslinking agent or any substance capable of acting as separate crosslinking agent. A skilled person being uncertain whether a certain substance or material is capable of such unintentional action as separate crosslinking agent can simply check this. To this end, he or she can mix the organic polymer system (C) with the substance in question and heat the mixture up, for example, up to <300° C. and check whether a crosslinking reaction takes place which coincides with a molecular mass increase.

Typically, the silver sintering preparation of the invention does not comprise substances capable of generating free radicals at temperatures <300° C. or within the temperature range prevailing during the steps of the method of the invention, in particular during its sintering step (b). This is in particular true if the silver sintering preparation of the invention or, to be more precise, its organic polymer system (C) comprises one or more organic polymers having free-radically polymerizable groups. The silver sintering preparation of the invention is then definitely free of such substances. Examples of such substances include thermally cleavable free-radical initiators like peroxides or azo compounds.

Typically, the silver sintering preparation of the invention does not comprise substances capable of acting like or of liberating cationic initiators at temperatures <300° C. or within the temperature range prevailing during the steps of the method of the invention, in particular during its sintering step (b). This is in particular true if the silver sintering preparation of the invention or, to be more precise, its organic polymer system (C) comprises one or more organic polymers having cationically polymerizable groups. The silver sintering preparation of the invention is then definitely free of such substances.

Examples of the at least one organic polymer of the organic polymer system (C) include phenoxy ether resins (thermoplastic copolymers of bisphenol A and epichlorohydrin), phenolic resins, polyimides, polyamides, polysulfones, benzoxazine resins, melamine formaldehyde resins, acrylonitrile butadiene styrene copolymers, (meth)acryl copolymers, polyesters, polyurethanes, polysiloxanes and any hybrids thereof. Phenoxy ether resins, phenolic resins, polyimides and polysulfones are preferred examples.

Cellulose or cellulose derivatives like etherified and/or esterified celluloses (cellulose ethers, cellulose esters and cellulose ether esters) are not chemically essentially stable in the aforementioned sense. Rather, they would decompose under the sintering conditions of step (b). Therefore, the organic polymer system (C) does not comprise cellulose or cellulose derivatives such as etherified and/or esterified celluloses (cellulose ethers, cellulose esters and cellulose ether esters).

The weight average molar mass $M_w$ of the at least one organic polymer may be in the range of, for example, >1000 to 100000, as determined by gel permeation chromatography (GPC; divinylbenzene-crosslinked polystyrene as the immobile phase, tetrahydrofuran as the liquid phase, polystyrene standards).

The at least one organic polymer may exhibit a glass transition temperature ($T_g$) which may be in the range of, for example, >60° C. to 190° C., as determined by Differential Scanning calorimetry (DSC) with a heating rate of, for example, 5 K per minute.

Together with the organic solvent (D) the organic polymer system (C) forms a continuous phase within the silver sintering preparation of the invention. This means that the organic polymer system (C) or any organic polymer constituent thereof is not present in particulate or disperse form within the silver sintering preparation of the invention. Rather, the organic polymer system (C) forms a continuous homogeneous phase together with the organic solvent (D), for example, in the form of a solution or a more or less viscous composition of organic matter.

The silver sintering preparation of the invention comprises 6 to 30 wt.-%, preferably 8 to 25 wt.-% and most preferably 10 to 25 wt.-% of organic solvent (D), i.e. an organic solvent or a mixture of at least two organic solvents.

The organic solvent or solvents is/are organic solvent(s) that is/are used commonly for silver sintering preparations. Examples include alcohols, e.g. terpineols, tridecanols; glycol ethers, e.g. tripropylene glycol monomethyl ether, dipropylene glycol monobutyl ether, diethylene glycol monohexyl ether; esters, e.g. dipropylene glycol methylether acetate, diethyl adipate, dibasic esters.

In accordance with the afore made disclosure, the silver sintering preparation of the invention can comprise a total of 0 to 10 wt.-% of one or more further ingredients (E) different from ingredients (A) to (D) (ingredients other than ingredients (A) to (D)). Said further ingredients can preferably be ingredients that are used commonly in silver sintering preparations. Examples include additives like dispersion agents, surfactants, defoaming agents, viscosity-controlling (rheological) agents and sintering agents.

The wt.-% fractions specified for ingredients (A) to (E) can add up, for example, to 100 wt.-% with respect to the silver sintering preparation of the invention, i.e. prior to the application thereof. Accordingly, the silver sintering preparation of the invention can be produced by mixing ingredients (A) to (E). Devices known to a person skilled in the art, such as stirrers and three-roller mills, can be used in this context. It is advantageous that the silver sintering preparation of the invention can be stored at temperatures of, for example, 2 to 25° C., i.e. a huge cooling effort is not required during its storage or transportation.

The silver sintering preparation of the invention can be used in a sintering process. Sintering shall be understood to mean the connecting of two or more electronic components by heating without the silver flake particles (A) reaching the liquid phase. In the context of the present disclosure said use in a sintering process can be defined as a method for the connection of electronic components, in which (a) a sandwich arrangement is provided, which comprises at least (a1) an electronic component 1, (a2) an electronic component 2, and (a3) the silver sintering preparation according to any of its afore disclosed embodiments being situated between metal contact surfaces of the electronic components 1 and 2, and in which (b) the sandwich arrangement is being sintered.

As is conventional for electronic components, each of the electronic components 1 and 2 has a metal contact surface. Insofar as the electronic components 1 and 2 do not consist of metal, their contact surfaces are covered by a metallization layer. In an embodiment, the metal contact surfaces can be made of a non-precious metal such as, for example, copper, nickel or aluminum. In another embodiment, the metal contact surfaces can be made of a precious metal such as silver. It is also possible, that one of the metal contact surfaces is made of a non-precious metal and the other metal contact surface is made of a precious metal.

Connecting at least two electronic components shall be understood to mean attaching a first electronic component on a second electronic component. In this context, "on" simply means that a metal contact surface of the first electronic component is being connected to a metal contact surface of the second electronic component regardless of the relative disposition of the two electronic components or of the sandwich arrangement comprising the at least two electronic components.

The electronic components 1 and 2 to be connected can be identical or different electronic components. The present invention facilitates not only the connection of precious metal contact surfaces of the electronic components, but also, in particular, the connection of a non-precious metal contact surface to a precious metal contact surface or even the connection of two non-precious metal contact surfaces of the electronic components in a manner that results in a reliable connection at room temperature and at elevated temperatures. For example, aluminum-nickel, aluminum-copper, aluminum-silver, aluminum-aluminum, copper-silver, copper-nickel, copper-copper, silver-nickel or silver-silver connections can be formed. The terms "aluminum, copper, nickel and silver metal contact surfaces" include metal contact surfaces made of alloys of said metals. Just like in case of silver or other precious metal contact surfaces, even in case of non-precious metal contact surfaces like copper, nickel or aluminum surfaces there is no need for a pretreatment thereof prior to carrying out the sintering step (b).

Accordingly, if two electronic components, i.e. electronic component 1 and electronic component 2, are to be connected to each other, the silver sintering preparation of the invention is situated between the metal contact surfaces of electronic component 1 and electronic component 2 prior to performing the sintering process of step (b). On the other hand, it is conceivable to connect more than two electronic components to each other. For example, three electronic components, i.e. electronic component 1, electronic component 2 and an electronic component 3, can be connected to each other in appropriate manner such that electronic component 2 is situated between electronic component 1 and electronic component 3. In this case, the silver sintering preparation of the invention is situated between both electronic component 1 and electronic component 2 as well as between electronic component 2 and electronic component 3, or, to be more precise, between the metal contact surfaces thereof.

Preferably, first, the metal contact surface of one of the electronic components is provided with the silver sintering preparation of the invention. Then, the other electronic component is placed by its metal contact surface on the silver sintering preparation that has been applied to the metal contact surface of the first electronic component.

Application of the silver sintering preparation of the invention onto the metal contact surface of an electronic component can be performed by means of conventional methods. Examples include dispensing, screen printing, stencil printing, pin transfer and dipping. Preferably, the thickness of the wet layer of the silver sintering preparation between the electronic components to be connected is in the range of 20 to 100 micrometers (μm). In this context, thickness of the wet layer shall be understood to mean the layer thickness prior to drying, if any, and prior to sintering step (b). The preferred wet layer thickness depends on the method selected for applying the silver sintering preparation. If the silver sintering preparation is applied, for example, by means of screen printing or dispensing, the wet layer thickness can preferably be in the range of 20 to 50 μm. If the silver sintering preparation is applied by means of stencil printing, the preferred wet layer thickness can be in the range of 20 to 100 μm.

As an option, a drying step is introduced prior to the sintering step (b), i.e. organic solvent is then removed from the applied silver sintering preparation. The drying step can be performed prior to forming the sandwich arrangement, i.e. after application of the sinter preparation to the metal contact surface of electronic component 1 and before connecting with the metal contact surface of electronic component 2, or after assembling of the sandwich arrangement. According to a preferred embodiment, the fraction of organic solvent in the silver sintering preparation after drying is, for example, 0 to 5 wt.-% with respect to the original fraction of organic solvent in the silver sintering preparation of the invention, i.e. in the silver sintering preparation ready for application. In other words, according to said preferred embodiment, for example, 95 to 100 wt.-% of the organic solvent that is originally present in the silver sintering preparation of the invention are removed during drying. The drying temperature may be in the range of, for example, 100 to 150° C. Common drying times are in the range of, for example, 5 to 45 minutes.

The sandwich arrangement of the at least two electronic components 1 and 2 and silver sintering preparation situated between their metal contact surfaces is finally subjected to a sintering process in step (b).

Regardless of the metal contact surface type of the electronic components to be connected, the actual sintering can proceed at a temperature of <300° C., for example, in the range of 200 to 280° C. or 200 to 250° C. with or without applying mechanical pressure and/or with or without pretreatment of the precious metal or non-precious metal contact surfaces.

The sintering time is, for example, in the range of 2 to 60 minutes, for example, in the range of 2 to 5 minutes in pressure sintering and, for example, in the range of 30 to 60 minutes in sintering without mechanical pressure.

The mechanical pressure in pressure sintering is preferably less than 30 MPa and more preferably less than 5 MPa. For example, the mechanical pressure is in the range of 1 to 30 MPa and more preferably it is in the range of 1 to 5 MPa.

Performing the sintering step (b) without application of mechanical pressure allows pressure-sensitive, for example fragile electronic components or electronic components with a mechanically sensitive micro-structure, to be used. Electronic components that have a mechanically sensitive micro-structure suffer electrical malfunction when exposed to inadmissible mechanical pressure.

The sintering step (b) can take place in an atmosphere that is not subject to any specific limitations. Use of a reducing atmosphere like a hydrogen/nitrogen or formic acid/nitrogen gas mixture or vacuum is not necessary although possible. Accordingly, on the one hand, the sintering can take place in an atmosphere that comprises oxygen, provided no non-precious metal contact surface of an electronic component is involved in the sintering. On the other hand, it is feasible just as well that the sintering takes place in an inert or oxygen-free atmosphere, for example, a nitrogen or argon atmosphere. In case a non-precious metal contact surface of an electronic component is involved in the sintering of step (b) it is a requirement to work in an inert or oxygen-free atmosphere; however, working in a reducing atmosphere is even in such case not required. In the scope of the invention, an oxygen-free atmosphere shall be understood to mean an atmosphere whose oxygen content is no more than 100 ppm, preferably no more than 80 ppm, and even more preferably no more than 50 ppm.

The sintering step (b) can take place in a conventional suitable apparatus for sintering, in which the above-mentioned process parameters can be set.

In order to obtain a connection strength between the electronic components which fulfills or even exceeds requirements (a stable connection), the method of the invention does not require 1) a pretreatment of the metal contact surfaces of the electronic components to be connected, 2) an extraordinary high sintering temperature, or 3) application of mechanical pressure during sintering; this is true independent of the metal type of the metal contact surfaces involved. As has already been disclosed above, in case of a non-precious metal contact surface being involved, the requirement of performing sintering step (b) in an inert or oxygen-free atmosphere or in a vacuum needs to be met; however, working in a reducing atmosphere is not required.

Hence, in an embodiment, it is even possible that the method of the invention is a method for the connection of electronic components, in which (a) a sandwich arrangement is provided, which comprises at least (a1) an electronic component 1, (a2) an electronic component 2, and (a3) the silver sintering preparation according to any of its afore disclosed embodiments being situated between non-pretreated metal contact surfaces of the electronic components, and in which (b) the sandwich arrangement is being sintered, wherein the metal of at least one of the non-pretreated metal contact surfaces of the electronic components is a non-precious metal, and wherein the sintering step (b) is carried out in an inert atmosphere without application of mechanical pressure at a sintering temperature in the range of 200–300° C.

EXAMPLES

1. Production of Silver Sintering Preparations:

Silver sintering preparations 2 to 5 (according to the invention) and reference paste 1 were produced by mixing the individual ingredients according to table 1 at comparable rheological behavior. All amounts given are in units of wt.-%.

TABLE 1

|  | Reference paste 1 | Paste 2 | Paste 3 | Paste 4 | Paste 5 |
|---|---|---|---|---|---|
| Silver particles[1] | 66.80 | 66.80 | 66.80 | 62.00 | 58.00 |
| Silver carbonate | 19.95 | 19.95 | 19.95 | 18.00 | 17.00 |
| Terpineol | 3.00 | 3.31 |  |  |  |
| Ethylcellulose | 0.25 |  |  |  |  |
| 2-Ethyl-1,3-hexanediol | 8.00 |  |  |  |  |
| Isooctadecyl alcohol | 2.00 |  |  |  |  |
| Dimethyl phthalate |  | 5.80 |  |  | 5.00 |
| DBE[2] |  | 2.48 |  |  |  |
| Diethylene glycol monoethyl acetate |  |  | 4.00 | 8.00 |  |
| y-butyrolactone |  |  | 1.00 | 6.00 | 15.00 |
| Diethyl adipate |  |  | 4.25 |  |  |
| Phenoxy ether resin[3] |  | 1.66 | 4.00 | 4.50 |  |
| Phenolic resin[4] |  |  |  | 1.50 |  |
| Polyimide[5] |  |  |  |  | 5.00 |
| Total | 100 | 100 | 100 | 100 | 100 |

[1]Silver flakes having a mean particle size ($d_{50}$) of 4 μm with a coating of 0.7 wt.-% lauric acid/stearic acid (weight ratio 1:3)
[2]Dibasic ester 422053 from Sigma-Aldrich
[3]Phenoxy ether resin (bisphenol A/epichlorohydrin resin) having a weight average molar mass $M_w$ of 52000 Da
[4]GP phenolic resin BKRmolecular-2620 from Georgia-Pacific Chemicals LLC
[5]MATRIMID 5218 US from Huntsman 2. Application and Pressure-Free Sintering of Compositions 1 to 5:

The respective composition was applied by means of dispensing onto the copper surface of a lead frame made of a copper-rich copper/iron alloy (96 wt.-% copper, 4 wt.-% Fe) to produce a 30 μm thick wet layer. Then, the applied composition was contacted without previous drying to a silicon chip via its 2×2 mm silver metal contact surface. The subsequent pressure-free sintering took place according to the following heating profile in a nitrogen atmosphere comprising max. 50 ppm of oxygen: The contact site was heated steadily to 200° C. over the course of 60 minutes and then maintained at 200° C. for 60 minutes. Then, the so formed arrangement was cooled steadily to 30° C. over the course of 60 minutes.

After the sintering, the bonding strength was determined by shear testing. In this context, the electronic components were sheared off with a shearing chisel at a rate of 0.3 mm/s at room temperature. The force was measured by means of a load cell (DAGE 4000 plus device made by DAGE, Germany). Table 2 shows the results obtained with compositions 1 to 5.

TABLE 2

|  | Composition | | | | |
|---|---|---|---|---|---|
|  | 1 | 2 | 3 | 4 | 5 |
| Shear strength at room temperature (N/mm²) | 1.0 | 9.2 | 22.4 | 17.6 | 10.8 |

The invention claimed is:
1. A silver sintering preparation comprising:
(A) 30 to 88 wt.-% of silver flake particles having a mean particle diameter ($d_{50}$) in the range of >1 to 20 μm,
(B) 5 to 30 wt.-% of at least one silver precursor,
(C) 1 to 10 wt.-% of an organic polymer system, and
(D) 6 to 30 wt.-% of organic solvent,
wherein the organic polymer system (C) is chemically essentially stable at temperatures <300° C. and forms a continuous phase together with the organic solvent (D).
2. The silver sintering preparation of claim 1, wherein the silver flake particles (A) comprise a surface coating comprising at least one type of organic compound.
3. The silver sintering preparation of claim 2, wherein the at least one type of organic compound is selected from the group consisting of free fatty acids, fatty acid salts and fatty acid esters.
4. The silver sintering preparation of claim 1, wherein the at least one silver precursor is selected from the group consisting of silver carbonate, silver(I) lactate, silver(II) formate, silver citrate, silver(I) oxide and silver(II) oxide.
5. The silver sintering preparation of claim 1, wherein the organic polymer system (C) consists of at least one organic polymer.
6. The silver sintering preparation of claim 5, wherein the at least one organic polymer is selected from the group consisting of phenoxy ether resins, phenolic resins, polyimides, polyamides, polysulfones, benzoxazine resins, melamine formaldehyde resins, acrylonitrile butadiene styrene copolymers, (meth)acryl copolymers, polyesters, polyurethanes, polysiloxanes and any hybrids thereof.
7. The silver sintering preparation of claim 5, wherein the at least one organic polymer has a weight average molar mass $M_w$ of >1000 to 100000, as determined by gel permeation chromatography.
8. The silver sintering preparation of claim 5, wherein the at least one organic polymer exhibits a glass transition temperature $T_g$ in the range of >60° C. to 190° C., as determined by Digital Scanning calorimetry (DSC) with a heating rate of 5 K per minute.
9. The silver sintering preparation of claim 1, further comprising a total of 0 to 10 wt.-% of one or more further ingredients (E) different from ingredients (A) to (D).
10. A method for the connection of electronic components, in which (a) a sandwich arrangement is provided, which comprises at least (a1) an electronic component 1, (a2) an electronic component 2, and (a3) a silver sintering preparation of claim 1 being situated between metal contact surfaces of the electronic components, and in which (b) the sandwich arrangement is being sintered.
11. The method of claim 10, wherein each of the electronic components 1 and 2 has a metal contact surface.
12. The method of claim 11, wherein the metal contact surfaces of the electronic components 1 and 2 are made of (i) non-precious metal selected from the group consisting of copper, nickel and aluminum or of (ii) a precious metal or (iii) one of the metal contact surfaces is made of non- precious metal selected from the group consisting of copper, nickel and aluminum and the other is made of precious metal.

13. The method of claim 12, wherein there is no pretreatment of a non-precious metal contact surface prior to carrying out the sintering step (b).

14. The method of claim 10, wherein the sintering proceeds at a temperature of 200 to 280° C. with or without applying mechanical pressure and with or without pretreatment of the precious metal or non-precious metal contact surfaces.

15. The method of claim 10, wherein when a non-precious metal contact surface of an electronic component is involved in the sintering of step (b), the sintering of step (b) is performed in an inert or oxygen-free atmosphere.

* * * * *